(12) United States Patent
Zhou

(10) Patent No.: US 10,586,713 B2
(45) Date of Patent: Mar. 10, 2020

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/685,820

(22) Filed: Aug. 24, 2017

(65) Prior Publication Data
US 2018/0068866 A1    Mar. 8, 2018

(30) Foreign Application Priority Data
Sep. 5, 2016   (CN) .......................... 2016 1 0803018

(51) Int. Cl.
*H01L 21/324*    (2006.01)
*H01L 21/02*    (2006.01)
(Continued)

(52) U.S. Cl.
CPC ...... *H01L 21/324* (2013.01); *H01L 21/02164* (2013.01); *H01L 21/02219* (2013.01);
(Continued)

(58) Field of Classification Search
CPC ......... H01L 21/02107; H01L 21/02123–0214; H01L 21/02164; H01L 21/02214–02216;
(Continued)

(56) References Cited

U.S. PATENT DOCUMENTS 8,557,712 B1    10/2013  Antonelli et al.
9,331,074 B1 *   5/2016  Chang ................. H01L 27/0886
(Continued)

FOREIGN PATENT DOCUMENTS

CN        104733390 A     6/2015
WO     2014204477 A1    12/2014

OTHER PUBLICATIONS

The European Patent Office (EPO) The Extended European Search Report for 17188710.2 dated Dec. 1, 2017 18 Pages.
(Continued)

*Primary Examiner* — Maliheh Malek
(74) *Attorney, Agent, or Firm* — Anova Law Group, PLLC

(57) ABSTRACT

Semiconductor devices and fabrication methods thereof are provided. An exemplary fabrication method includes providing a semiconductor substrate; forming a plurality of fins on a surface of the semiconductor substrate; forming an isolation flowable layer covering the plurality of fins over the semiconductor substrate; performing a first annealing process to turn the isolation flowable layer into an isolation film; and forming first well regions and second well regions in the fins and the semiconductor substrate. The second well regions are at two sides of the first well regions and contact with the first well regions; the first well regions have a first type of well ions; the second well regions have a second type of well ions; and the first type is opposite to the second type in the conductivities.

13 Claims, 5 Drawing Sheets

(51) Int. Cl.

| | | |
|---|---|---|
| *H01L 21/8238* | (2006.01) | |
| *H01L 21/8234* | (2006.01) | |
| *H01L 27/092* | (2006.01) | |
| *H01L 23/532* | (2006.01) | |
| *H01L 27/088* | (2006.01) | |
| *H01L 29/06* | (2006.01) | |
| *H01L 29/66* | (2006.01) | |

(52) U.S. Cl.
CPC .. *H01L 21/02271* (2013.01); *H01L 21/02326* (2013.01); *H01L 21/02337* (2013.01); *H01L 21/823431* (2013.01); *H01L 21/823462* (2013.01); *H01L 21/823821* (2013.01); *H01L 21/823878* (2013.01); *H01L 21/823892* (2013.01); *H01L 23/53271* (2013.01); *H01L 27/0886* (2013.01); *H01L 27/0924* (2013.01); *H01L 29/0649* (2013.01); *H01L 29/66795* (2013.01)

(58) Field of Classification Search
CPC ......... H01L 21/02554; H01L 21/02565; H01L 21/0257–02579; H01L 21/02664; H01L 21/027; H01L 21/033; H01L 21/64; H01L 21/70; H01L 21/707; H01L 21/76–762; H01L 21/76256; H01L 21/7627; H01L 21/76283; H01L 21/76819; H01L 21/823462; H01L 21/823821; H01L 21/823431; H01L 21/02255; H01L 21/02345–02354; H01L 21/324; H01L 21/3247; H01L 21/76822; H01L 21/76825; H01L 21/76828; H01L 27/0886; H01L 27/0924; H01L 29/0642–0649; H01L 29/66795
See application file for complete search history.

(56) References Cited

U.S. PATENT DOCUMENTS

| | | | | |
|---|---|---|---|---|
| 9,368,569 B1* | 6/2016 | Leobandung | ..... | H01L 29/66795 |
| 9,379,182 B1* | 6/2016 | Chen | ..... | H01L 29/0673 |
| 9,385,189 B1* | 7/2016 | Sung | ..... | H01L 29/0638 |
| 9,418,900 B1* | 8/2016 | He | ..... | H01L 21/823878 |
| 9,449,882 B1* | 9/2016 | Wang | ..... | H01L 21/823431 |
| 9,698,266 B1* | 7/2017 | Cheng | ..... | H01L 29/7849 |
| 9,773,778 B2* | 9/2017 | Zhou | ..... | H01L 27/0629 |
| 9,984,939 B2* | 5/2018 | Zhou | ..... | H01L 21/26513 |
| 9,985,037 B2* | 5/2018 | Zhou | ..... | H01L 21/02271 |
| 9,985,144 B2* | 5/2018 | Zhou | ..... | H01L 21/76895 |
| 10,002,869 B2* | 6/2018 | Zhou | ..... | H01L 29/66803 |
| 10,038,079 B1* | 7/2018 | Ohtou | ..... | H01L 29/66795 |
| 10,096,518 B2* | 10/2018 | Zhou | ..... | H01L 21/02236 |
| 10,157,771 B2* | 12/2018 | Zhou | ..... | H01L 21/7624 |
| 2007/0040221 A1* | 2/2007 | Gossner | ..... | H01L 27/0288 257/355 |
| 2010/0155827 A1* | 6/2010 | Kim | ..... | H01L 29/42392 257/327 |
| 2011/0081782 A1 | 4/2011 | Liang et al. | | |
| 2013/0148409 A1* | 6/2013 | Chung | ..... | G11C 17/18 365/148 |
| 2013/0270641 A1* | 10/2013 | Chi | ..... | H01L 21/823821 257/351 |
| 2013/0280883 A1* | 10/2013 | Faul | ..... | H01L 21/2255 438/434 |
| 2014/0070322 A1* | 3/2014 | Jacob | ..... | H01L 21/823431 257/368 |
| 2014/0167120 A1* | 6/2014 | Chi | ..... | H01L 27/0886 257/288 |
| 2015/0004772 A1 | 1/2015 | Tsai et al. | | |
| 2015/0024572 A1* | 1/2015 | Jacob | ..... | H01L 21/76243 438/404 |
| 2015/0076514 A1* | 3/2015 | Morin | ..... | H01L 29/7843 257/77 |
| 2015/0140787 A1* | 5/2015 | Zhang | ..... | H01L 21/30604 438/478 |
| 2015/0179501 A1* | 6/2015 | Jhaveri | ..... | H01L 21/76224 257/506 |
| 2015/0179503 A1* | 6/2015 | Tsai | ..... | H01L 21/76224 257/347 |
| 2015/0200127 A1* | 7/2015 | Chuang | ..... | H01L 21/76205 257/622 |
| 2015/0255456 A1* | 9/2015 | Jacob | ..... | H01L 27/0886 257/401 |
| 2015/0255609 A1* | 9/2015 | Zhu | ..... | H01L 29/6681 257/401 |
| 2015/0318349 A1 | 11/2015 | Zhu | | |
| 2015/0318396 A1* | 11/2015 | Zhu | ..... | H01L 29/66795 257/192 |
| 2015/0380558 A1* | 12/2015 | Huang | ..... | H01L 29/66795 257/288 |
| 2016/0099352 A1 | 4/2016 | Lee et al. | | |
| 2016/0104776 A1* | 4/2016 | Ching | ..... | H01L 29/1083 257/401 |
| 2016/0204215 A1* | 7/2016 | Chang | ..... | H01L 21/845 257/401 |
| 2016/0211372 A1* | 7/2016 | Yu | ..... | H01L 29/7848 |
| 2016/0218199 A1* | 7/2016 | Tsai | ..... | H01L 29/66803 |
| 2016/0225659 A1* | 8/2016 | Jacob | ..... | H01L 21/76213 |
| 2016/0225676 A1* | 8/2016 | Jacob | ..... | H01L 21/845 |
| 2016/0233088 A1* | 8/2016 | Feng | ..... | H01L 21/2256 |
| 2016/0240624 A1* | 8/2016 | Zhu | ..... | H01L 21/76897 |
| 2016/0284684 A1* | 9/2016 | Zhou | ..... | H01L 27/0629 |
| 2016/0322501 A1* | 11/2016 | Cheng | ..... | H01L 29/7851 |
| 2016/0329253 A1* | 11/2016 | Liu | ..... | H01L 29/66795 |
| 2016/0329331 A1* | 11/2016 | Tsai | ..... | H01L 21/76224 |
| 2016/0343621 A1* | 11/2016 | Cheng | ..... | H01L 21/76229 |
| 2016/0343709 A1* | 11/2016 | Kim | ..... | H01L 27/0886 |
| 2016/0358911 A1* | 12/2016 | Chen | ..... | H01L 27/0886 |
| 2016/0358912 A1* | 12/2016 | Chen | ..... | H01L 27/0886 |
| 2016/0372551 A1* | 12/2016 | Doris | ..... | H01L 29/1054 |
| 2017/0018452 A1* | 1/2017 | Dou | ..... | H01L 29/42356 |
| 2017/0018465 A1* | 1/2017 | He | ..... | H01L 21/823878 |
| 2017/0025535 A1* | 1/2017 | Wu | ..... | H01L 29/7843 |
| 2017/0062280 A1* | 3/2017 | Li | ..... | H01L 21/823821 |
| 2017/0069539 A1* | 3/2017 | Li | ..... | H01L 21/823431 |
| 2017/0069631 A1* | 3/2017 | Basker | ..... | H01L 21/823821 |
| 2017/0084741 A1* | 3/2017 | Lin | ..... | H01L 29/7842 |
| 2017/0117187 A1* | 4/2017 | Ando | ..... | H01L 21/823807 |
| 2017/0117188 A1* | 4/2017 | Zhou | ..... | H01L 21/823821 |
| 2017/0154827 A1* | 6/2017 | Zhou | ..... | H01L 21/26513 |
| 2017/0154962 A1* | 6/2017 | Zhou | ..... | H01L 21/76224 |
| 2017/0186654 A1* | 6/2017 | Li | ..... | H01L 21/823814 |
| 2017/0194155 A1* | 7/2017 | Anderson | ..... | H01L 21/28518 |
| 2017/0352663 A1* | 12/2017 | Zhou | ..... | H01L 21/0332 |
| 2018/0005870 A1* | 1/2018 | Hsu | ..... | H01L 21/823431 |
| 2018/0012888 A1* | 1/2018 | Zhou | ..... | H01L 29/66803 |
| 2018/0040604 A1* | 2/2018 | Zhou | ..... | H01L 21/26513 |
| 2018/0047613 A1* | 2/2018 | Zhou | ..... | H01L 21/7624 |
| 2018/0047631 A1* | 2/2018 | Zhou | ..... | H01L 21/02236 |
| 2018/0047812 A1* | 2/2018 | Leobandung | ..... | H01L 29/1083 |
| 2018/0076202 A1* | 3/2018 | Basker | ..... | H01L 27/0924 |
| 2018/0096999 A1* | 4/2018 | Zhou | ..... | H01L 21/76232 |
| 2018/0102437 A1* | 4/2018 | Zhou | ..... | H01L 21/28123 |
| 2018/0122896 A1* | 5/2018 | Zhou | ..... | H01L 21/02164 |
| 2018/0145131 A1* | 5/2018 | Wang | ..... | H01L 21/0217 |
| 2018/0145172 A1* | 5/2018 | Zhou | ..... | H01L 21/823468 |
| 2018/0261606 A1* | 9/2018 | Zhou | ..... | H01L 27/1211 |
| 2018/0294161 A1* | 10/2018 | Shen | ..... | H01L 21/28518 |
| 2018/0308746 A1* | 10/2018 | Hu | ..... | H01L 21/76232 |
| 2018/0315839 A1* | 11/2018 | Zhou | ..... | H01L 29/66795 |
| 2018/0323192 A1* | 11/2018 | Li | ..... | H01L 27/0886 |
| 2018/0337101 A1* | 11/2018 | Zhou | ..... | H01L 21/823878 |
| 2018/0337268 A1* | 11/2018 | Zhou | ..... | H01L 29/66803 |
| 2018/0350694 A1* | 12/2018 | Zhou | ..... | H01L 21/823481 |
| 2018/0350969 A1* | 12/2018 | Ching | ..... | H01L 29/785 |
| 2018/0366580 A1* | 12/2018 | Zhou | ..... | H01L 29/7848 |
| 2018/0374752 A1* | 12/2018 | Zhou | ..... | H01L 21/823481 |

(56) References Cited

U.S. PATENT DOCUMENTS

2018/0374756 A1* 12/2018 Basker ............... H01L 29/6653
2019/0287958 A1*  9/2019 Zhou ............... H01L 21/823418

OTHER PUBLICATIONS

Ryan E Todd et al., "Effect of low temperature anneals and nonthermal treatments on the properties of gap fill oxides used in SiGe and III-V devices", Journal of Applied Physics, American Institute of Physics, US, vol. 120, No. 4, Jul. 28, 2016 (Jul. 28, 2016), XP012209718, ISSN: 0021-8979, DOI: 10.1063/1.4959213.
The European Patent Office (EPO) The Extended European Search Report for 17188710.2 dated Mar. 26, 2018 19 Pages.

* cited by examiner

SEMICONDUCTOR DEVICE AND FABRICATION METHOD THEREOF

CROSS-REFERENCES TO RELATED APPLICATIONS

This application claims the priority of Chinese patent application No. 201610803018.4, filed on Sep. 5, 2016, the entirety of which is incorporated herein by reference.

FIELD OF THE DISCLOSURE

The present disclosure generally relates to the field of semiconductor manufacturing technologies and, more particularly, relates to semiconductor devices and fabrication methods thereof.

BACKGROUND

Metal-oxide-semiconductor (MOS) transistors are one of the important components in modern integrated circuits (ICs). The basic structure of an MOS transistor includes a semiconductor substrate, a gate structure formed on the semiconductor substrate, and source/drain regions formed in the semiconductor substrate at two sides of the gate structure. The gate structure includes a gate dielectric layer formed on the surface of the semiconductor substrate and a gate electrode layer formed on the gate dielectric layer.

With the continuous development of the semiconductor technology, the control ability of the gate structures of the conventional planar MOS transistors to their channel regions have become weak; and a severe leakage current issue is generated. Fin field-effect transistors (FinFETs) are a type of multiple-gate devices, which are able to solve the leakage current issue. A typical FinFET structure includes a semiconductor substrate, a plurality of fins protruding from the surface of the semiconductor substrate formed on the semiconductor substrate, gate structures covering portions of side and top surfaces of the fins formed over the semiconductor substrate, and source/drain doping regions formed in the fins at two sides of the gate structures.

Although the FinFET structures may be able to solve the leakage current issue, the performance of the FinFET structures formed by the existing methods needs further improvements. The disclosed methods and semiconductor devices are directed to solve one or more problems set forth above and other problems in the art.

BRIEF SUMMARY OF THE DISCLOSURE

One aspect of the present disclosure includes a method for fabricating a semiconductor device. The method includes providing a plurality of fins on a surface of a semiconductor substrate; forming an isolation flowable layer covering the plurality of fins over the semiconductor substrate; performing a first annealing process to turn the isolation flowable layer into an isolation film; and forming first well regions and second well regions in the fins and the semiconductor substrate. The second well regions are at two sides of the first well regions and contact with the first well regions; the first well regions have a first type of well ions; the second well regions have a second type of well ions; and the first type is opposite to the second type in conductivities.

Another aspect of the present disclosure includes a semiconductor device. The semiconductor device includes a plurality of fins formed on a surface of a semiconductor substrate; an isolation film formed among the fins on the semiconductor substrate, a top surface of the isolation film being below top surfaces of the plurality of fins; and first well regions and second well regions formed in the fins and the semiconductor substrate. The second well regions are at two sides of the first well regions and contact with the first well regions; the first well regions have a first type of well ions, the second well regions have a second type of well ions, and the first type is opposite to the second type. The first well regions and the second well regions are formed by forming an isolation flowable layer covering the plurality of fins over the semiconductor substrate; performing a first annealing process to turn the isolation flowable layer into an isolation film; and forming the first well regions and the second well regions in the fins and the semiconductor substrate.

Other aspects of the present disclosure can be understood by those skilled in the art in light of the description, the claims, and the drawings of the present disclosure.

DETAILED DESCRIPTION

Figure 1:
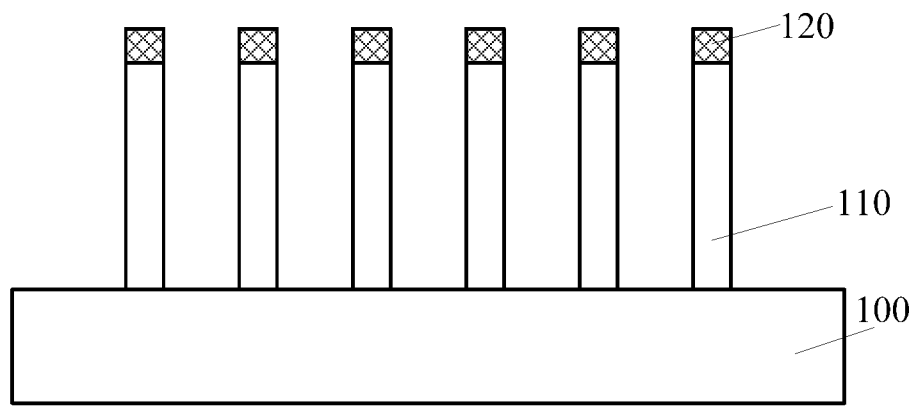
FIGS. 1-13 illustrate semiconductor structures corresponding to certain stages of an exemplary fabrication process of a semiconductor device consistent with the disclosed embodiments.

Reference will now be made in detail to exemplary embodiments of the disclosure, which are illustrated in the accompanying drawings. Wherever possible, the same reference numbers will be used throughout the drawings to refer to the same or like parts.

The electrical properties of the semiconductor devices formed by existing methods may be undesired. An existing fabrication method of a semiconductor device includes providing a semiconductor substrate having a plurality of fins; forming N-type well regions, and P-type well regions at two sides of the N-type well regions and adjacent to the N-type well regions; and forming an isolation film over the semiconductor structure to cover the fins by a flowable chemical vapor deposition (FCVD) process. The FCVD process includes a water vapor annealing process. The isolation film is used to form isolation structures.

Specifically, the FCVD process for forming the isolation film includes forming an isolation flowable layer covering the semiconductor substrate over the semiconductor substrate; and performing the water vapor thermal annealing process to the isolation flowable layer to form the isolation film from the isolation flowable layer. The water vapor thermal annealing process is used to oxidize the isolation flowable layer; and cause the isolation flowable layer to turn from the flowable state to a solid state; and the isolation film is formed.

The water vapor thermal annealing process is performed after forming the P-type well regions and N-type well regions. Thus, during the water vapor thermal annealing process, the thermal annealing process is also performed on the P-type well regions. Because the temperature of the water vapor thermal annealing process is relatively high, and the process time of the water vapor thermal annealing process is relatively long, i.e., too much thermal budget, the diffusion of the P-type well regions is relatively severe during the water vapor thermal annealing process. Further, because there is no N-type well regions between the P-type well regions and the semiconductor substrate, a punch-through issue is easy to occur between the bottoms of adjacent P-type well regions. Further, the bottoms of the N-type well regions are easy to merge together due to the high thermal budget of the FCVD process (the water vapor thermal annealing process).

To reduce the possibility of the punch-through issues, it is often to increase the concentration of the N-type ions in the N-type well regions to cause the longitudinal depth of the N-type well regions to be greater than the longitudinal depth of the P-type well regions. However, after increasing the concentration of the N-type ions in the N-type well regions, when the source/drain regions are subsequently formed in the corresponding N-type well regions, the junction capacitances between the source/drain regions in the N-type well regions and the portions of the N-type well regions around the source/drain regions are relatively large. Correspondingly, the leakage current may be relatively large.

The present disclosure provides a semiconductor device and a fabrication method thereof. The fabrication method includes providing a semiconductor substrate having a plurality of fins; forming an isolation flowable layer covering the fins over the semiconductor substrate; performing a first annealing process to the isolation flowable layer to form an isolation film from the isolation flowable layer; and forming first well regions and second well regions in the fins and the semiconductor substrate. The second well regions may be at two sides of the first well regions and contact the first well regions. The first well regions may be doped with a first type of well ions; and the second well regions may be doped with a second type of well ions. The first type may be opposite to the second type in conductivities.

Because the first well regions and the second well regions may be formed in the fins and the semiconductor substrate after performing the first annealing process, the first annealing process may not affect the first well regions and the second well regions. Thus, the severe diffusion of the second type of well ions into the bottoms of the first well regions caused by the first annealing process may be avoided. Accordingly, it may be uneasy for the second well regions to have the punch-through issue under the first well regions. Therefore, the electrical properties of the semiconductor devices may be improved.

Figure 13:
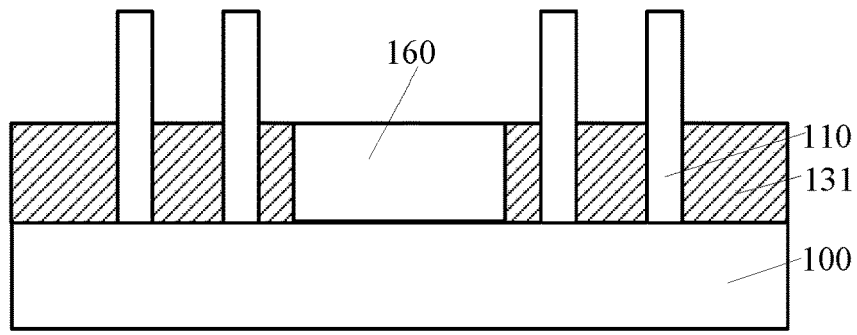
Figure 14:
FIG. 14 illustrates an exemplary fabrication process of a semiconductor device consistent with the disclosed embodiments.

FIG. 14 illustrates an exemplary fabrication process of a semiconductor device consistent with the disclosed embodiments. FIGS. 1-13 illustrate semiconductor structures corresponding to certain stages of the exemplary fabrication process.

As shown in FIG. 14, at the beginning of the fabrication process, a semiconductor substrate with certain structures is provided (S101). FIG. 1 illustrates a corresponding semiconductor structure.

As shown in FIG. 1, a semiconductor substrate 100 is provided; and a plurality of fins 110 may be formed on the surface of the semiconductor substrate 100. The semiconductor substrate 100 provides a process base for forming the semiconductor device.

The semiconductor substrate 100 may be made of any appropriate material, such as signal crystalline silicon, polysilicon, or amorphous silicon, etc. The semiconductor substrate 100 may also be germanium, silicon germanium, or gallium arsenide, etc. In one embodiment, the semiconductor substrate 100 is made of single crystalline silicon.

The fins 110 may be formed on the semiconductor substrate 100 by any appropriate process. In one embodiment, the fins 110 are formed by etching the semiconductor substrate 100. Specifically, a mask layer 120 may be formed on the surface of the semiconductor substrate 100. The mask layer 120 may define the size and the positions of the fins 110. Then, portions of the semiconductor substrate 100 may be etched using the mask layer 120 as an etching mask; and the fins 120 may be formed.

The mask layer 120 may be made of any appropriate material, such as silicon nitride, or silicon oxynitride, etc. After forming the fins 110, the mask layer 120 may be kept on the top surfaces of the fins 120. In some embodiments, the mask layer may be removed after forming the fins.

In some embodiments, a fin material layer may be formed on the surface of the semiconductor substrate. Then, the fin material layer may be patterned to form the plurality of fins.

In one embodiment, the fins 110 are made of single crystalline silicon. In some embodiments, the fins may be made of single crystalline germanium, or single crystalline silicon germanium, etc.

In one embodiment, the semiconductor substrate 100 may include first regions (not labeled) and second regions (not labeled). The fins 110 may be formed on the semiconductor substrate 100 in the first regions and the second regions, respectively.

Figure 2:
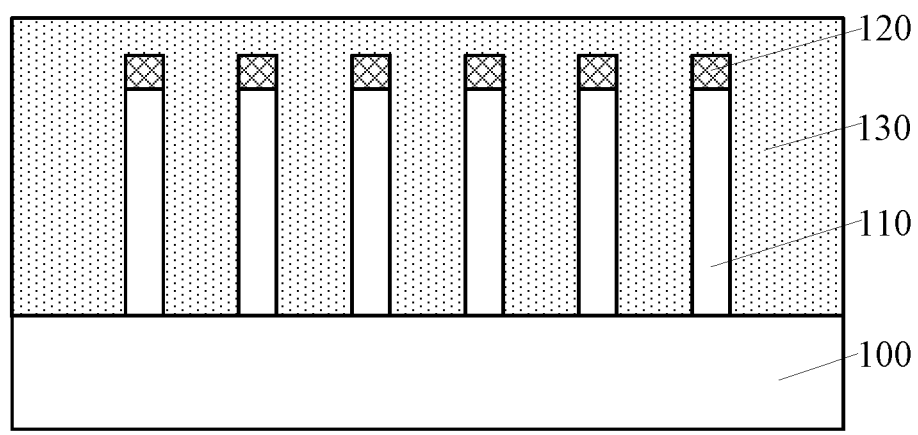

Returning to FIG. 14, after forming the fins 110, an isolation flowable layer may be formed (S102). FIG. 2 illustrates a corresponding semiconductor structure.

As shown in FIG. 2, an isolation flowable layer 130 is formed over the semiconductor substrate 100. The isolation flowable layer 130 may also cover the fins 110. In some embodiments, the isolation flowable layer 130 may be a shallow trench isolation (STI) gap filling layer.

In one embodiment, the mask layer 120 may be retained. Thus, the isolation flowable layer 130 may also cover the mask layer 120.

The isolation flowable layer 130 may contain a large quantity of hydrogen atoms; and may be at a flowable state. The isolation flowable layer 130 may be used to subsequently form an isolation film.

Various processes may be used to form the isolation flowable layer 130. In one embodiment, an FCVD process is used to form the isolation flowable layer 130. That is, the FCVD process may be used to fill the isolation flowable layer 130 into the gaps among the fins 110.

In one embodiment, the reaction gases for forming the isolation flowable layer 130 may include $NH_3$ and $(SiH_3)N$, etc. The flow rate of $NH_3$ may be in a range of approximately 1 sccm-1000 sccm. The flow rate of $(SiH_3)_3N$ may be in a range of approximately 3 sccm-800 sccm. The temperature of the process for forming the isolation flowable layer 130 may be in a range of approximately 50° C.-100° C.

Figure 3:
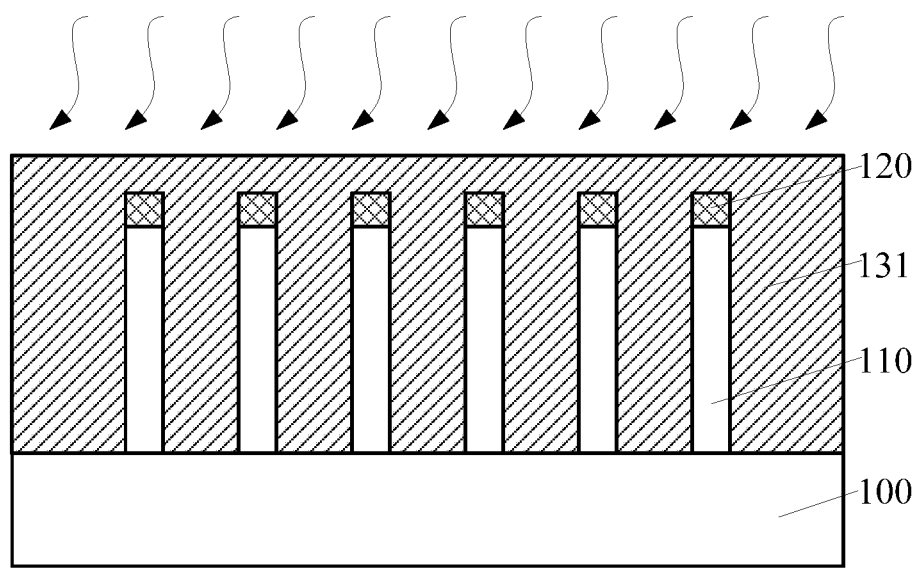

Returning to FIG. 14, after forming the isolation flowable layer 130, a first annealing process may be performed (S103). FIG. 3 illustrates a corresponding semiconductor structure.

As shown in FIG. 3, a first annealing process is performed on the isolation flowable layer 130; and the isolation flowable layer 130 may be turned into an isolation film 131. In one embodiment, the isolation film 131 is made of silicon oxide. In some embodiments, the isolations film 131 may be made of other appropriate isolation material.

The first annealing process may be any appropriate annealing process, such as a furnace thermal annealing process, a spike annealing process, or a laser annealing process, etc. In one embodiment, the environment of the first annealing process may have oxygen, ozone, and water vapor, etc. The temperature of the first annealing process may be in a range of approximately 350° C.-750° C. The time duration of the first annealing process may be in a range of approximately 24 mins-35 mins.

During the first annealing process, the oxygen, the ozone and the water vapor in the environment may treat the isolation flowable layer 130 respectively under the temperature in a range of approximately 350° C.-750° C. The oxygen element in the oxygen, the ozone and the water vapor in the environment may partially or completely substitute the hydrogen element in the isolation flowable layer 130 to reduce the hydrogen element in the isolation flowable layer 130. Further, under the temperature in the range of 350° C.-750° C., the isolation flowable layer 130 may be turned from the flowable state to the solid state. Thus, the isolation film 131 may be formed.

Additionally, after the first annealing process, a densifying annealing process may be performed to the isolation film 131. The densifying annealing process may densify the internal structure of the isolation film 131. Further, if there is residual hydrogen in the isolation film 131, the densifying annealing process may be able to further remove the residual hydrogen in the isolation film 131.

The densifying annealing process may be performed in a nitrogen environment. The temperature of the densifying annealing process may be in a range of approximately 850° C.-1050° C. The time duration of the densifying annealing process may be in a range of approximately 30 mins-120 mins.

Figure 4:
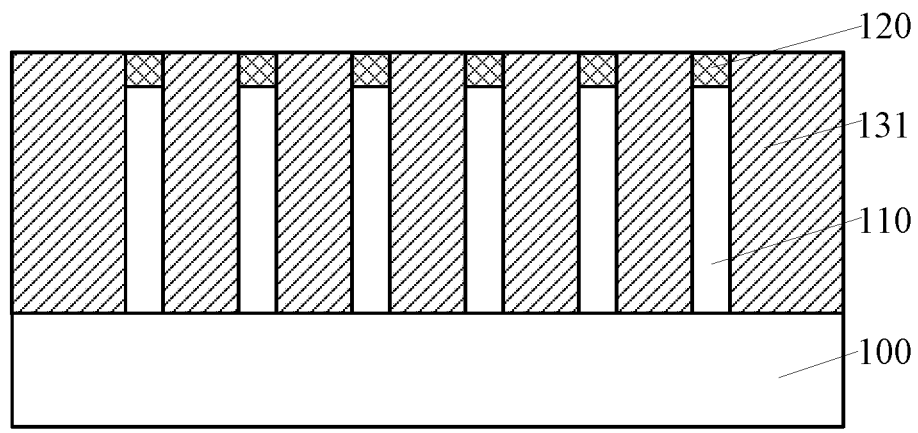

Returning to FIG. 14, after performing the first annealing process to form the isolation film 131, a planarization process may be performed (S104). FIG. 4 illustrates a corresponding semiconductor structure.

As shown in FIG. 4, a planarization process is performed on the top surface of the isolation film 131 until the surface of the mask layer 120 is exposed. In some embodiments, the mask layer 120 is not kept on the top surfaces of the fins 110, the planarization process may be performed on the mask layer 120 until the top surfaces of the fins 110 are exposed.

The planarization process may be any appropriate process. In one embodiment, the planarization process is a chemical mechanical polishing (CMP) process.

Figure 5:
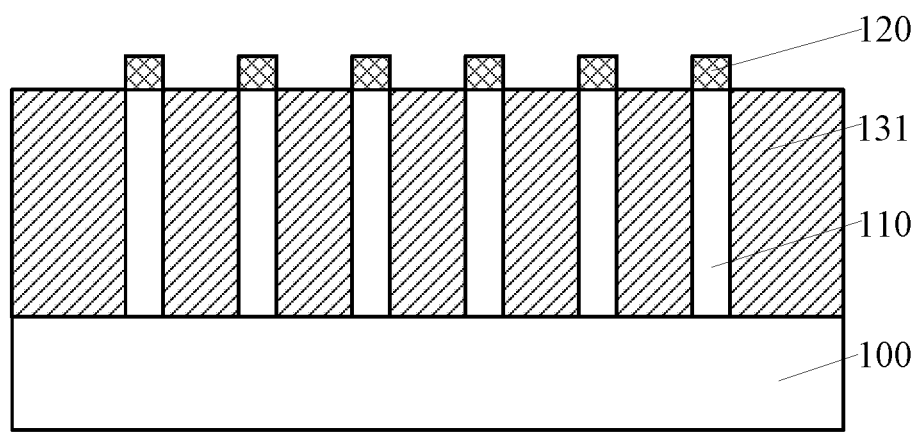

Returning to FIG. 14, after performing the planarization process, the isolation film 131 may be recessed (S105). FIG. 5 illustrates a corresponding semiconductor structure.

As shown in FIG. 5, the surface of the isolation film 131 is recessed to be level with the bottom surface of the mask layer 120 (the top surfaces of the fins 110). The surface of the isolation film 131 may be recessed by etching the isolation film 131.

Recessing the surface of the isolation film 131 to be level with the bottom surface of the mask layer 120 may completely expose the side and top surfaces of the mask layer 120. Thus, the mask layer 120 may be easily to remove subsequently; and no residual mask layer 120 may be left. Further, after subsequently removing the mask layer 120, dent structures may not be formed in the isolation film 131.

In some embodiments, after performing the planarization process, the isolation layer may not be recessed.

Figure 6:
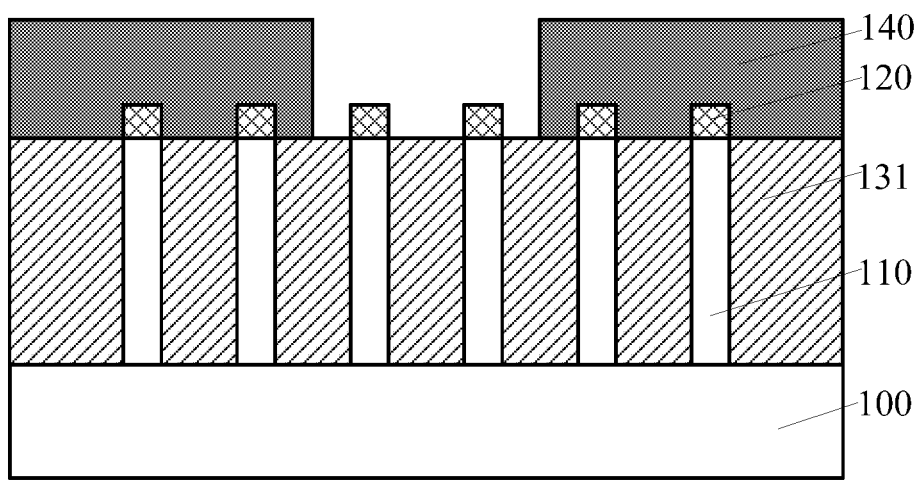

Returning to FIG. 14, after recessing the top surface of the isolation film 131, a patterned photoresist layer may be formed (S106). FIG. 6 illustrates a corresponding semiconductor structure.

As shown in FIG. 6, a patterned mask layer 140 is formed on the surfaces of the isolation film 131 and the mask layer 120 in the first regions. The surfaces of the mask layer 120 and the isolation film 131 in the second regions may be exposed by the patterned mask layer 140. In some embodiments, if there is no mask layer on the fins, the patterned mask layer may cover the isolation film and the fins in the first regions; and the patterned mask layer may expose the isolation film and the fins in the second regions.

Figure 7:
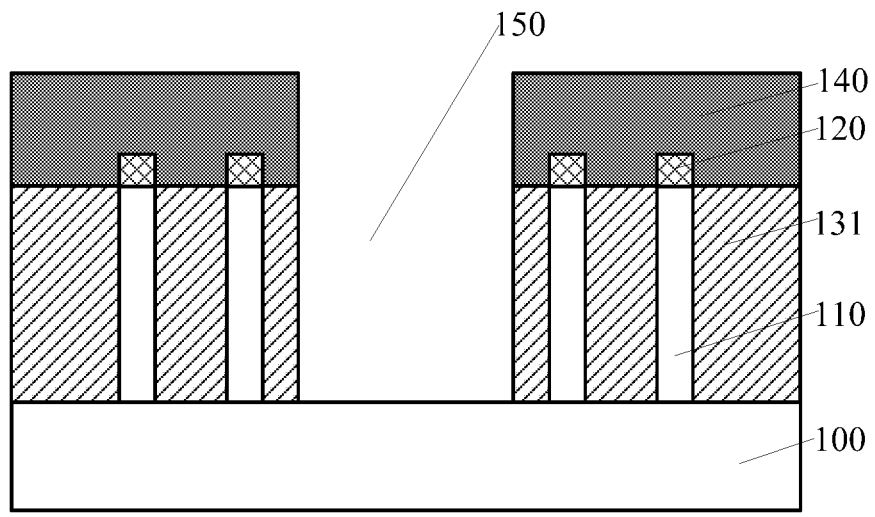

Returning to FIG. 14, after forming the patterned mask layer 140, an opening may be formed (S107). FIG. 7 illustrates a corresponding semiconductor structure.

As shown in FIG. 7, an opening 150 is formed. The opening 150 may expose the surface of the semiconductor substrate 100 in the second regions.

The opening 150 may be formed by etching the fins 110, the isolation film 131 and the mask layer 120 in the second regions using the patterned mask layer 140 as an etching mask. In some embodiments, if there is no mask layer on the surfaces of the fins, the opening may be formed by etching the fins 110 and the isolation film 131 in the second regions.

The fins 120 in the second regions may be removed. Thus, the distance between the fins at two sides of the opening 150 may be greater than the distance between adjacent fins at one side of the opening 150. Such a structural configuration may match the requirements of the circuit design.

Figure 8:
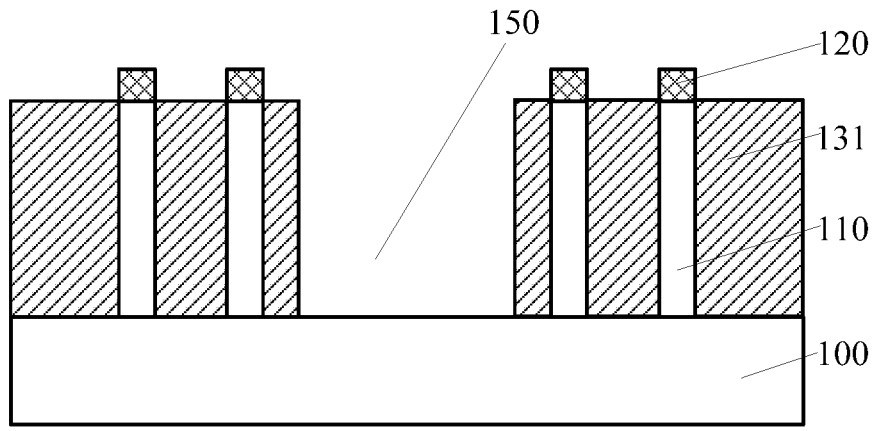

After forming the opening 150, as shown in FIG. 8, the patterned photoresist layer 140 may be removed. The patterned photoresist layer 140 may be removed by any appropriate process, such as a dry etching process, a wet etching process, or a plasma ashing process, etc.

Figure 9:
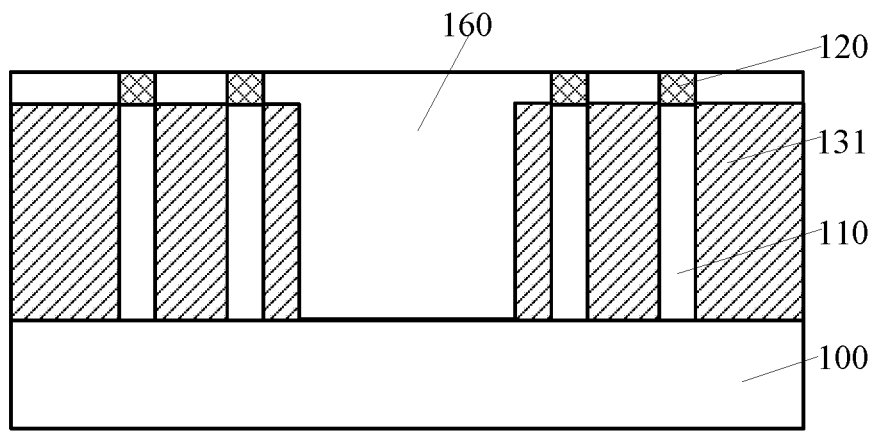

Returning to FIG. 14, after forming the opening 150, an additional isolation film may be formed (S108). FIG. 9 illustrates a corresponding semiconductor structure.

As shown in FIG. 9, an additional isolation film 160 is formed in the opening 150. In one embodiment, the surface of the isolation layer 131 may be below the top surface of the mask layer 120. Thus, the additional film 160 may also cover the isolation film 131. In some embodiments, when the surface of the isolation film is level with the top surface of the mask layer, the additional isolation film may be only in the opening.

In some embodiments, the fins and the isolation film in the second regions may not be removed. Accordingly, the additional isolation film may not need to be formed.

Figure 10:
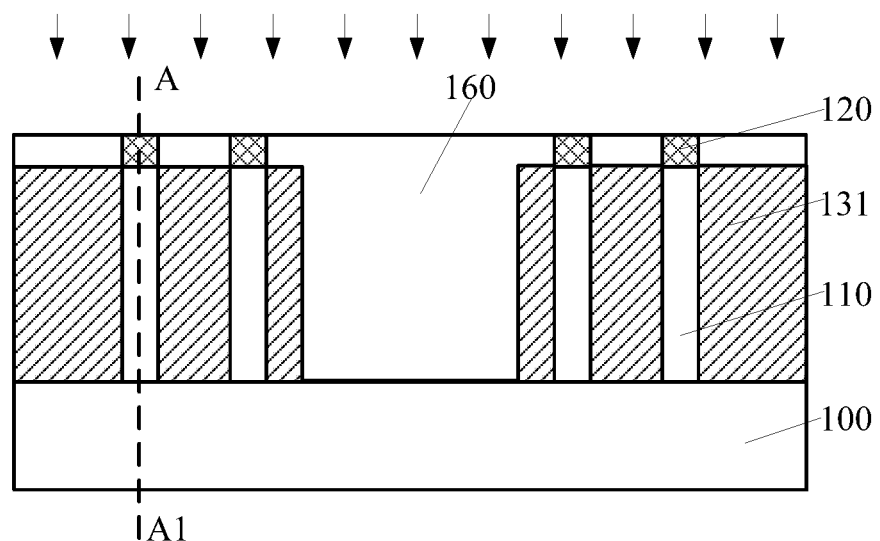
Figure 11:
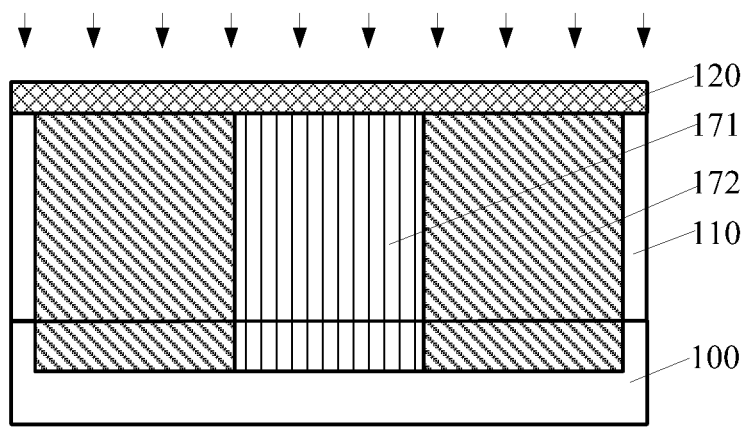

Returning to FIG. 14, after forming the additional isolation film 160, first well regions and second well regions may be formed (S109). FIGS. 10-11 illustrate a corresponding semiconductor structure; and FIG. 11 is the cross-sectional view of the structure illustrated in FIG. 10 along the A-A1 direction.

As shown in FIGS. 10-11, first well regions 171 and second well regions 172 are formed in the fins 110 and the semiconductor substrate 100. The second well regions 172 may be at the two sides of the first well regions 171; and may contact with the first well regions 171. For illustrative purposes, one first well region 171 is illustrated in FIG. 11, although any number of the first well regions may be included in the present disclosure.

The first well regions 171 may be doped with a first type of well ions; and the second well regions 172 may be doped with a second type of well ions. The first type may be opposite to the second type.

When the conductive type of the first type of well ions is P-type, the conductive type of the second type of well ions may be N-type. When the conductive type of the first type of well ions is N-type, the conductive type of the second type of well ions may be P-type.

The type of the FinFETs corresponding to the first well regions 171 may be opposite to the type of the FinFETs corresponding to the second well regions 172.

In one embodiment, the first well regions 171 are formed firstly; and then the second well regions 172 may be formed.

In some embodiments, the second well regions 172 may be formed firstly; and then the first well regions 171 may be formed.

Specifically, a process for forming the first well regions 171 may include forming a first mask layer (not shown) on the isolation film 131 and the fins 110; and implanting the first type of well ions in the semiconductor substrate 100 and the fins 110 using the first mask layer as a mask. Thus, the first well regions 171 may be formed.

Specifically, a process for forming the second well regions 172 may include forming a second mask layer (not shown) on the isolation film 131 and the fins 110; and implanting the second type of well ions in the semiconductor substrate 100 and the fins 110 using the second mask layer as a mask. Thus, the second well regions 172 may be formed.

After forming the first well regions 171 and the second regions 172, a well annealing process may be performed. The well annealing process may be able to activate the first type of well ions and the second type of well ions.

The well annealing process may be performed in a nitrogen environment. The temperature of the well annealing process may be in a range of approximately 900° C.-1050° C. The time duration of the well annealing process may be in a range of approximately 0 s-20 s.

In some embodiments, the planarization process may be omitted. That is, the first well regions and the second well regions may be formed after the first thermal annealing process.

Figure 12:
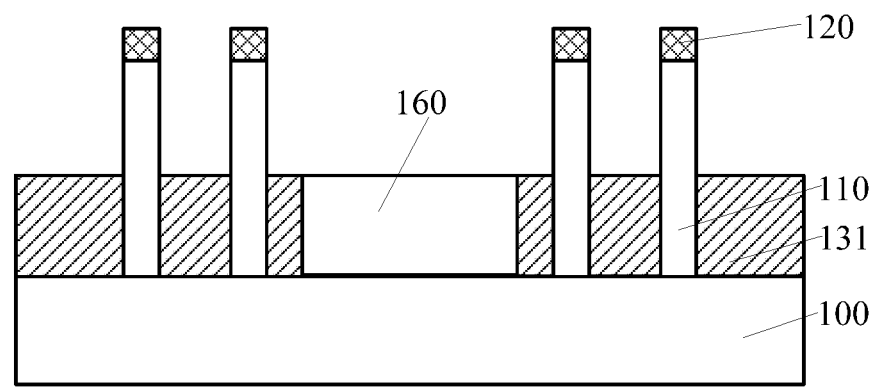

Returning to FIG. 14, after forming the first well regions and the second well regions, an etch-back process may be performed (S110). FIG. 12 illustrates a corresponding semiconductor structure based on the structure illustrated in FIG. 10.

As shown in FIG. 12, an etch-back process is performed to the isolation film 131 and the additional isolation film 160 to cause the surfaces of the isolation film 131 and the additional isolation film 160 to be below the top surfaces of the fins 120. The remaining isolation film 131 and the remaining additional isolation film 160 may form the isolation structures among the fins 110.

In some embodiments, if the opening and the additional isolation film are omitted, the etch-back process may be performed on the isolation film to cause the surface of the isolation film to be below the top surfaces of the fins.

After the etch-back process, as show in FIG. 13, the mask layer 120 may be removed. The mask layer 120 may be removed by any appropriate process, such as a dry etching process, or a wet etching process, etc.

In some embodiments, after a first annealing process and before forming the first well regions and the second well regions, third well regions may be formed in the semiconductor substrate by doping a third type of well ions. The conductive type of the third type of well ions may be identical to the conductive type of the first type of well ions. After forming the first well regions and the second well regions, the third well regions may be on the bottoms of the first well regions and the second well regions. Other fabrication steps may be similar to those of the previous describe embodiments.

Because the third well regions may be on the bottoms of the first well regions and the second well regions, and the conductive type of the third type of well ions and the conductive type of the first well ions may be the same, and the conductive type of the third type of well ions may be opposite to the conductive type of the second type of well ions, the third well regions may further prevent the punch-through issue at the bottom regions of the second well regions.

Thus, a semiconductor device may be formed by the disclosed methods and processes. FIG. 13 illustrates a corresponding semiconductor device.

As shown in FIG. 12, the semiconductor device includes a semiconductor substrate 100 and a plurality of fins 110 formed on the surface of the semiconductor substrate 100. Further, the semiconductor device may also include an isolation film 131 formed on the surface of the semiconductor substrate 100 among the fins 110 in first regions and an additional isolation film 160 on the surface of the semiconductor substrate 100 in the second regions. The top surfaces of the isolation film 131 and the additional isolation film 160 may be below the top surfaces of the fins 110. Further, the semiconductor device may also include first well regions and second well regions formed in the fins and semiconductor substrates. The detailed structures and intermediate structures are described above with respect to the fabrication processes.

Thus, according to the disclosed embodiments, after performing the first annealing process to the isolation flowable layer, the first well regions and the second well regions may be formed in the fins and the semiconductor substrate. Thus, the first annealing process may not affect the first well regions and the second well regions. Thus, the severe diffusion of the second type of well ions in the second well regions into the bottom regions of the first well regions may be avoided. Because the scale of the diffusion of the second type of well ions into the bottom regions of the first well regions may be relatively small, the punch-through issue may not easy to happen at the bottom regions of the first well regions. Thus, the electrical properties of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
    providing a plurality of fins on a surface of the semiconductor substrate;
    forming an isolation flowable layer covering the plurality of fins over the semiconductor substrate;
    performing a first annealing process to turn the isolation flowable layer into an isolation film;
    performing a planarization process until top surfaces of the fins are exposed; and
    forming first well regions and second well regions in the fins and the semiconductor substrate, the second well regions being at two sides of the first well regions and contacting with the first well regions, the first well regions having a first type of well ions, the second well regions having a second type of well ions, and the first type being opposite to the second type, wherein the semiconductor substrate includes first regions and second regions, and the fins are formed on the surface of the semiconductor substrate in the first regions and the second regions, the first regions being at two sides of the second regions, wherein, after the planarization process, the method further comprises:
removing the fins and the isolation film in the second region to form an opening;
forming an additional isolation film in the opening; and
forming first well regions and second well regions in the fins and the semiconductor substrate in the first region.

2. The method according to claim 1, further comprising:
performing an etch-back process to the isolation film and the additional isolation film, such that surfaces of the isolation film and the additional isolation film are below the top surfaces of the fins.

3. The method according to claim 1, wherein:
the first well regions are formed before forming the second well regions.

4. The method according to claim 1, wherein:
the first well regions are formed after forming the second well regions.

5. The method according to claim 3, wherein forming the first well regions comprises:
forming a first patterned mask layer over the isolation film and the fins; and
performing a first ion implantation process with the first type of well ions to the semiconductor substrate and the fins using the first patterned mask layer as a mask.

6. The method according to claim 3, wherein forming the second well regions comprises:
forming a second patterned mask layer over the isolation film and the fins; and
performing a second ion implantation process with the second type of well ions to the semiconductor substrate and the fins using the second patterned mask layer as a mask.

7. The method according to claim 1, after forming the first well regions and the second well regions, further comprising:
performing a well annealing process.

8. The method according to claim 7, wherein:
an environment of the well annealing process includes nitrogen gas;
a temperature of the well annealing process is in a range of approximately 900° C.-1050° C.; and
a time duration of the well annealing process is in a range of approximately 0 s-20 s.

9. The method according to claim 1, after the first annealing process and before forming the first well regions and the second well regions, further comprising:
performing a third ion implantation process with a third type of well ions in the semiconductor substrate to form third well regions in the semiconductor substrate,
wherein:
a conductive type of the third type of well ions is identical to a conductive type of the first type of well ions; and
the third well regions are on the bottoms of the first well regions and the second well regions.

10. The method according to claim 9, wherein:
the conductive type of the first type of well ions and the third type of well regions is P-type; and
a conductive type of the second type of well ions is N-type.

11. The method according to claim 9, wherein:
the conductive type of the first type of well ions and the third type of well regions is N-type; and
a conductive type of the second type of well ions is P-type.

12. The method according to claim 1, before forming the first well regions and the second well regions, further comprising:
performing a densifying annealing process to the isolation film.

13. The method according to claim 1, further comprising:
performing an etch-etch back process to the isolation film, such that a top surface of the isolation film is below the top surfaces of the fins.

* * * * *